United States Patent
Agoston et al.

(10) Patent No.: US 8,332,172 B2
(45) Date of Patent: Dec. 11, 2012

(54) SYSTEM FOR INDEPENDENTLY MODIFYING JITTER AND NOISE COMPONENTS IN A SIGNAL DIGITIZING INSTRUMENT

(75) Inventors: Maria Agoston, Beaverton, OR (US); Ronald M. Henricksen, Beaverton, OR (US); Pavel R. Zivny, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 13/333,970

(22) Filed: Dec. 21, 2011

(65) Prior Publication Data

US 2012/0158334 A1 Jun. 21, 2012

Related U.S. Application Data

(63) Continuation of application No. 12/610,085, filed on Oct. 30, 2009, now abandoned.

(51) Int. Cl.
*G01R 13/00* (2006.01)
*H04B 3/46* (2006.01)
(52) U.S. Cl. .......................................................... 702/69
(58) Field of Classification Search ...................... 702/69
See application file for complete search history.

(56) References Cited

U.S. PATENT DOCUMENTS

| 7,388,937 B1 * | 6/2008 | Rodger et al. ............... 375/348 |
| 7,522,661 B2 | 4/2009 | Nelson et al. |
| 2006/0018374 A1 * | 1/2006 | Nelson et al. ............... 375/227 |

OTHER PUBLICATIONS

Tektronix, Inc., "80SJNB Jitter, Noise, BER, and Serial Data Link Analysis Software Printed Help Document," #077-0011-02, pp. i-iv and 30-40, Jun. 2008.

* cited by examiner

*Primary Examiner* — Cindy H Khuu
(74) *Attorney, Agent, or Firm* — William K. Bucher

(57) ABSTRACT

A digitizing instrument is used for modifying pattern data and jitter and noise components of a communication signal. In a typical implementation, the midpoints of a rising edge slope and horizontal portion of the communication signal are determined and multiple digital data records are acquired at the midpoints. The data sample records are transformed to frequency components and the random jitter and noise, and periodic jitter and noise components are determined. A correlated pattern data and the jitter and noise components are matrix elements in a simulated signal channel having communication system elements. Each correlated pattern data and jitter and noise component may be modified for each of the communication system element. The selectively modified correlated pattern data and jitter and noise components are combined to produce a modified communication signal that is displayed as a numeric table, eye diagram or bit error rate presentation.

7 Claims, 6 Drawing Sheets

SYSTEM FOR INDEPENDENTLY MODIFYING JITTER AND NOISE COMPONENTS IN A SIGNAL DIGITIZING INSTRUMENT

CROSS-REFERENCE TO RELATED APPLICATION

This continuation application claims the benefit of U.S. application Ser. No. 12/610,085, filed Oct. 30, 2009.

BACKGROUND OF THE INVENTION

Bit Error Rate (BER) estimation methods for communication signals and similar signals using a sampling oscilloscope are based on well accepted jitter and noise breakdown methodologies. This approach allows tracking BER problems to jitter and noise components, giving insights into problems and facilitating design trade-offs. A typical jitter and noise breakdown scheme separates data pattern correlated signal degradation components from the uncorrelated ones. Then the random and deterministic jitter and noise components are broken down and separated as described in U.S. Pat. No. 7,522,661.

U.S. Pat. No. 7,522,661 is implemented in 80SJNB Jitter, Noise and BER Analysis Software used with a DSA8200 Digital Sampling Oscilloscope, both manufactured and sold by Tektronix, Inc., Beaverton, Oreg. The 80SJNB software produces a correlated pattern data of a communication signal as well as separated uncorrelated random and periodic jitter and noise components of the communication signal. The software emulates a physical signal path of the communication signal and allows the inserting of filter, channel and equalizer elements in the signal path. The software allows independent scaling of the random noise component of the communication signal in each of the emulated signal path elements.

When examining the effects of signal path impairments on a communication signal traveling in a serial data link, different components of the jitter and noise breakdown scheme should be handled according to their own characteristics. For example, using an equalizer to compensate for intersymbol interference, it makes sense to adapt the equalizer attributes to the data correlated signal degradation components of the communication signal. Providing the means of specifying custom processing functions for each of the jitter and noise components expand the analysis capabilities, thus enhancing the accuracy and reliability of BER estimations.

SUMMERY OF THE INVENTION

The present invention is a method of independently modifying measured jitter and noise components derived from measuring a signal using a digitizing instrument. The digitizing instrument acquires digital data samples of a communication signal, clock signal or the like and generates correlated pattern data of the sampled signal. Digital data samples of the signal are acquired and processed for respectively generating observed jitter and observed noise components. Random jitter and noise components and periodic jitter and noise components are characterized from the observed jitter and observed noise components. The correlated pattern data, random jitter and noise components, and periodic jitter and noise components of the sampled signal are selectively modified for each element of a plurality of elements in a simulated signal path. The selectively modified correlated pattern data, random jitter and noise components, and periodic jitter and noise components of the sampled signal are combined to produce a modified signal. The modified signal of combined selectively modified correlated pattern data, random jitter and noise components, and periodic jitter and noise components are displayed to illustrate changes in at least one of an eye diagram, bit error rate and table displays.

In a preferred implementation, the characterization of the random jitter and noise components and periodic jitter and noise components has a step of converting the digital data samples on an edge location and a horizontal or flat location of the signal to frequency domain representations prior to characterizing random jitter and noise components and periodic jitter and noise components. The characterized random jitter and noise components may be integrated to respectively produce a random jitter time value and random noise voltage value. The characterized periodic jitter and periodic noise components are converted to time domain values, and respective histograms of the periodic jitter and periodic noise components are produced. The values of the respective periodic jitter and periodic noise histograms generate a respective periodic jitter time value and a periodic noise voltage value.

Another benefit of this method is the possibility of removing or de-embedding impairment components, such as the jitter or noise of the digitizing instrument, in order to minimize the impact of the digitizing instrument on the measurement results. De-embedding the jitter and noise components of the digitizing instrument has the digitizing instrument acquiring digital data samples with no signal input to the instrument and converts the digital data samples to a frequency domain representation. The random jitter and noise components and the periodic jitter and noise components of the digitizing instrument are characterized. The characterized random and periodic jitter and noise components of the digitizing instrument are modified on the corresponding characterized random and periodic noise components of the sampled signal to de-embed the impairment components of the digitizing instrument. The combined selectively modified random jitter and noise components, periodic jitter and noise components, and the correlated pattern data of the sampled signal are displayed on a display device to illustrate changes in at least one of an eye diagram and bit error rate displays as a function of modifying the characterized random and periodic noise components of the digitizing instrument from the corresponding characterized random and periodic noise components of the sampled signal. The impairment components of the digitizing instrument may be partially de-embedded by modifying at least one of the characterized random and periodic noise components of the sampled signal with the characterized periodic jitter and noise components of the digitizing instrument.

The method of independently modifying pattern data and jitter and noise components in a signal may be used in varying the jitter and/or noise results, as well as the BER results in order to extend the emulation capabilities of the analysis. The slew rate of the communication signal is determined as a function of an approximation of a portion of an edge of the signal. The random jitter component is modified as a function of varying the characterized random noise by modifying the varied characterized random noise from the observed jitter component for each element of the plurality of elements in the simulated signal path. The combined selectively modified random jitter and noise components, periodic jitter and noise components, and the correlated pattern data of the signal is displayed on a display device that illustrate changes in at least one of an eye diagram and bit error rate displays as a function of modifying the varied characterized random noise from the observed jitter component.

The method of independently modifying pattern data and jitter and noise components in a communication signal may be used in estimating crosstalk in the communication signal. The characterization of the random jitter and noise components and periodic jitter and noise components has additional steps of identifying and storing magnitude and frequency values for peaks in the frequency domain representations of the observed jitter and observed noise of the sampled communications signal. The periodic jitter and periodic noise are determined in the stored magnitude and frequency values for peaks of the observed jitter and observed noise. The determined periodic jitter and periodic noise are converted to time domain representations and respective histograms of the time and voltage values of the respective periodic jitter and periodic noise. The peak-to-peak time and voltage values of the respective histograms of the periodic jitter and periodic noise are determined, and the difference between the peak-to-peak noise values of the periodic noise is displayed as crosstalk on the communication signal.

The objects, advantages and novel features of the present invention are apparent from the following detailed description when read in conjunction with appended claims and attached drawings.

DESCRIPTION OF THE INVENTION

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Part of the description will be presented in terms of operations performed by a digitizing instrument, using terms such as data, values, signal samples, numbers and the like, consistent with the manner commonly employed by those skilled in the art to convey the substance of their work to others skilled in the art. As is well understood by those skilled in the art, these quantities take the form of electrical or optical signals capable of being stored, transferred, combined and otherwise manipulated through mechanical and electrical components of the digitizing instrument; and the term digitizing instrument includes general purpose as well as special purpose data processing machines, systems, and the like, that are stand alone, adjunct or embedded.

Additionally, various operations will be described as multiple discrete steps in turn in a manner that is most helpful in understanding the present invention, however, the order of description should not be construed as to imply that these operations are necessarily order dependent, in particular, the order of their presentation.

Figure 1:
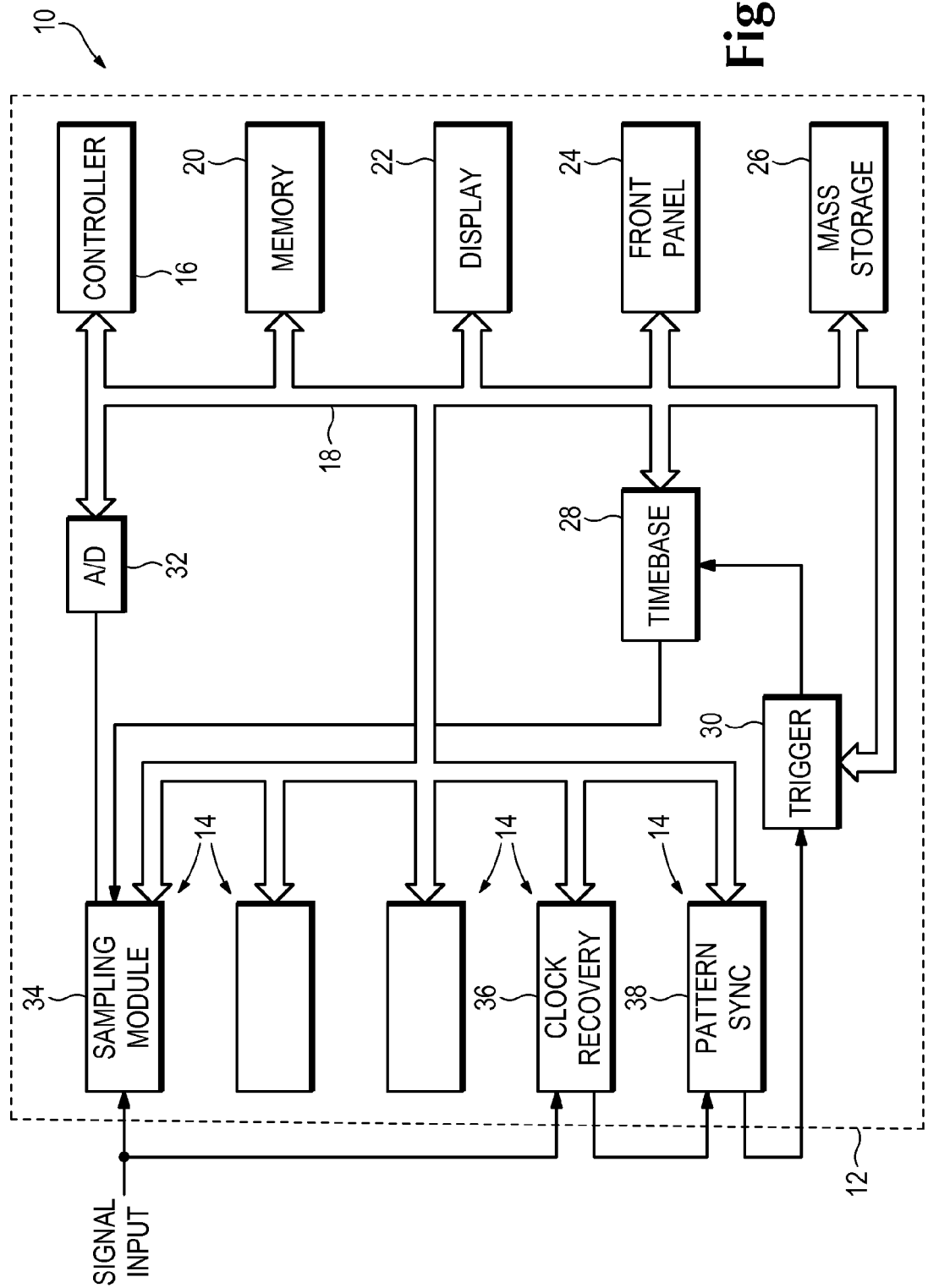
FIG. 1 is a block diagram of a representative digitizing instrument implementing the system for independently processing jitter and noise components in a signal.

Referring to FIG. 1, there is shown a representative block diagram of a digitizing instrument 10, such as the DSA8200 Digital Sampling Oscilloscope, manufactured and sold by Tektronix, Inc., Beaverton, Oreg., implementing the system for independently modifying jitter and noise components of a signal. The DSA8200 Digital Sampling Oscilloscope 10 has a mainframe 12 and a plurality of module bays or slots 14 that receive various plug-in modules designed for the oscilloscope 10. The mainframe 12 has a main controller 16, such as PENTIUM® microprocessor, manufactured and sold by Intel, Corp., Santa Clara, Calif. or other similar processors. The controller 16 is coupled via a system bus 18 to system memory 20 that includes RAM, ROM and cache memory with the RAM memory storing volatile data, such as the digitized values representative of the input signal, timebase calibration values, look-up tables and the like. The system bus 18 is also coupled to a display device 22, such a liquid crystal display, cathode ray tube or the like, and front panel controls 24 with buttons, rotatable knobs and the like and/or control entry devices, such as a keyboard and/or mouse. A mass storage unit or units 26, such as a hard disk drive, a CD ROM drive, a tape drive, a floppy drive or the like, that reads from and/or writes to appropriate mass storage media, may also be connected to the system bus 18. The system bus 18 is also coupled to the module bays 14, a timebase generator 28, and a trigger circuit 30. Program instructions that control the functions of the oscilloscope 10 may be stored and accessed from the ROM memory 20 or from the mass storage media of the mass storage unit 26. The oscilloscope 10 is preferably a PC based system functioning under the overall control of an operating system, such as the WINDOWS® operating system, manufactured and sold by Microsoft, Corp., Redmond, Wash. or other types of operating systems. Controller 16 and system bus 18 in the block diagram are representative of multiple controllers and busses used in the oscilloscope 10. A separate controller is used to control the acquisition of digitized samples with DSP controllers processing the signal samples and passing the processed samples to the control processor for display on display device 22.

The DSA8200 Digital Sampling Oscillscope 10 may be configured with a variety of plug-in modules for performing various measurements and analysis. The preferred configuration for implementing the system for independently modifying jitter and noise components in a signal is a Sampling Module 34 for sampling a signal, which may be a clock signal, a data signal, data signal having as embedded clock signal, and the like. Examples of the Sampling Modules are the 80E Series of Electrical Modules and the 80C Series of Optical modules, manufactured and sold by Tektronix, Inc. The incoming signal is also provided to a Clock Recovery Module 36, such as the 80A07, manufactured and sold by Tektronix, Inc., for recovering a clock signal from the incoming signal. The recovered clock signal is provided to a PatternSync Trigger Module 38, such as the 80E06, manufactured and sold by Tektronix, Inc., for dividing the clock signal for application to the trigger circuitry 30 in the oscilloscope 10.

Figure 2:
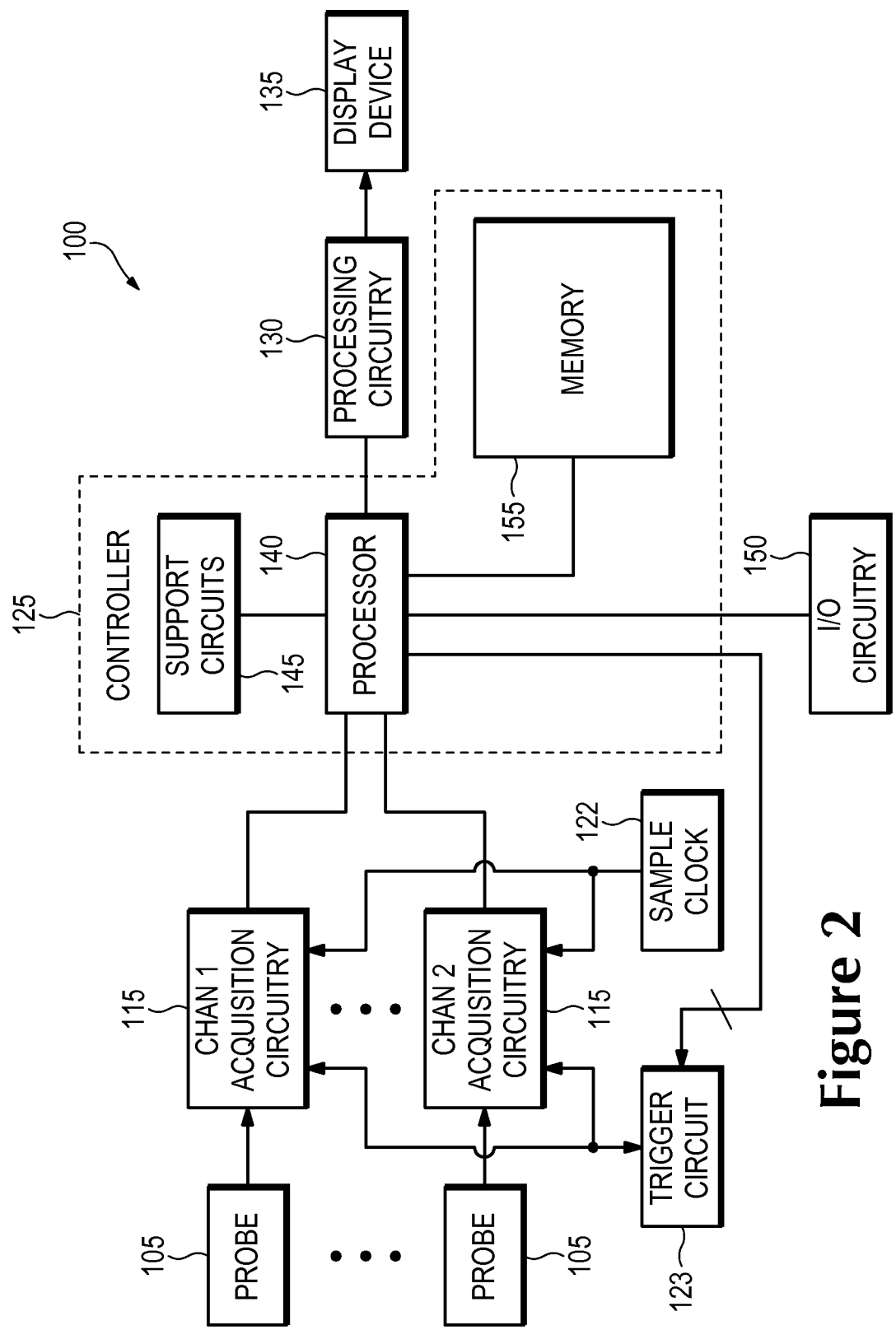
FIG. 2 is a block diagram of a representative real time digitizing instrument implementing the system for independently processing jitter and noise components in a signal.

Another digitizing instrument for implementing the present invention is a real time digitizing oscilloscope, such as the DPO70000B Series Digital Phosphor Oscilloscopes, manufactured and sold by Tektronix, Inc., Beaverton, Oreg. FIG. 2 depicts a high level block diagram of a real time digitizing oscilloscope 100 usable in implementing the system for modifying jitter and noise components in a signal.

Oscilloscope 100 include multiple signal channels with each signal channel having an input on which is connected a signal acquisition probe 105 for acquiring electrical signals from a device under test (DUT). The oscilloscope 100 signal channel inputs are coupled to respective signal channel acquisition circuitry 115. The respective acquisition circuitry 115 sample their respective input signals in accordance with a sample clock provided by an internal sample clock generator 122.

The acquisition circuitry 115 each include amplifier circuitry, analog-to-digital conversion circuitry, triggering circuitry, decimator circuitry, supporting acquisition memory, and the like. The acquisition circuitry 115 operate to digitize one or more of the signals under test at a sample rate to produce one or more respective sample streams suitable for use by controller 125 or processing circuitry 130. The acquisition circuitry 115, in response to commands received from the controller 125, changes trigger conditions, decimator functions, and other acquisition related parameters. The acquisition circuitry 115 communicates its respective resulting sample stream to the controller 125.

A trigger circuit 123 is shown separate from the acquisition circuitry 115 but one skilled in the art will realize that it could be internal to the acquisition circuitry. The trigger circuit 123 receives trigger parameters, such as trigger threshold level, hold off, post trigger acquisition, and the like, from the controller 125 in response to user input. The trigger circuit 123 conditions the acquisition circuitry 115 for capturing digital samples of the signal under test from the DUT.

The controller 125 operates to process the one or more acquired sample streams provided by the acquisition circuitry 115 representing a communications signal to generate respective sample stream data associated with one or more sample streams. The controller 125 operates to characterize a correlated pattern and jitter and noise components of a communication signal data and to selectively modify the correlated pattern and the jitter and noise components. The controller 125 produces waveform data from the unmodified or modified correlated pattern and the jitter and noise components and provides the waveform data to processing circuitry 130 for subsequent presentation on display device 135 as an eye diagram, bathtub display, table or the like.

The controller 125 of FIG. 2 preferably comprises a processor 140, such as PENTIUM® microprocessor, manufactured and sold by Intel, Corp., Santa Clara, Calif. or other similar processors, functioning under the overall control of an operating system, such as the WINDOWS® operating system, manufactured and sold by Microsoft, Corp., Redmond, Wash. or other type of operating system. The processor 140 support circuits 145 and memory 155. Processor 140 cooperates with conventional support circuitry 145, such as power supplies, clock circuits, cache memory, buffer/expanders, and the like, as well as circuits that assist in executing software routines stored in memory 155. As such, it is contemplated that some of the process steps discussed herein as software processes may be implemented within hardware, for example, as circuitry that cooperates with processor 140 to perform various steps. Controller 125 also interfaces with input/output (I/O) circuitry 150. For example, I/O circuitry 150 may comprise a keypad, pointing device, touch screen, or other means adapted to provide user input and output to the controller 125. The controller 125, in response to such user input, adapts the operations of acquisition circuitry 115 to perform various data acquisitions, triggering, processing, and display communications, among other functions. In addition, the user input may be used to trigger automatic calibration functions or adapt other operating parameters of display device 135, logical analysis, or other data acquisition devices.

Memory 155 may include volatile memory, such as SRAM, DRAM, among other volatile memories. Memory 155 may also include non-volatile memory devices, such as a disk drive or a tape medium, among others, or programmable memory, such as an EPROM, among others.

The implementation of the system for independently modifying pattern data and jitter and noise components of a signal will now be described using the digital sampling oscilloscope block diagram of FIG. 1 and a communication signal having a clock signal within a data pattern. It is understood that other types of signal may applied to this method without departing from the scope of the appended claims. The communication signal may be generated using a clock generator whose output is coupled to a data generator. The data generator combines the clock signal with a user defined data pattern and outputs the communication signal. The communication signal may also be received from a communications signal transmitter integrated circuit mounted on a test circuit board or on a circuit board implementing circuitry of one of the serial communications standards. The Sampling Module 34 receives the communication signal and couples the communication signal to sampling diodes within the Sampling Module 34. The communication signal is sampled in response to sampling strobes from the timebase 28. The sampling module 34 may include strobe shaping circuitry that shapes the strobe pulses and generates differential strobe pulses. The outputs of the sampling diodes may be summed and input to an operational amplifier that amplifies the combined sampled communication signal. The amplified output of the operational amplifier is coupled to a buffer amplifier that conditions the samples for input to an A/D converter 32. The A/D converter 32 converts the analog samples into digital values that are coupled via the system bus 18 to the memory 20 for storage and further processing. Alternately, the outputs of the sampling diodes are coupled to operational amplifiers that amplify sampled communications test signal. The amplified outputs are summed in a summing circuit and coupled to the buffer amplifier.

The Clock Recovery Module 36 extracts the clock signal from the communication signal and couples the clock signal to the PatternSync Trigger Module 38. The PatternSync Trigger Module 38 has processor controlled dividers that divide the clock signal to produce a pattern trigger output that equal to or less than the maximum sample rate of the oscilloscope. For sampling the communication signal at a nominal time location, the repetition rate is the number of bit patterns that need to be skipped between strobe pulses for sampling to occur at the same location in the pattern within the maximum sample rate of the oscilloscope. For example, for a 1 GB/s communications signal having a bit pattern of 127 requires a repetition rate of 40 in order for the pattern trigger rate to be within the maximum 200 KHz sample rate. The pattern trigger rate is determined by dividing the bit rate of the communications signal by the pattern length times the repetition rate. The pattern trigger rate in this example is 196.85 KHZ which is within the maximum sampling rate of the oscilloscope.

The pattern trigger output is coupled to the trigger circuit 30 which generates a trigger signal that is coupled to the timebase 28. The timebase 28 includes circuitry for generating a gated or phase controlled clock signal that is coupled to a strobe generator having counter circuitry and interpolator circuitry. The counter circuitry and interpolator circuitry establishing coarse and fine time delay increment relative to the pattern trigger output. The clock signal is coupled to counter circuitry and to the controller 16 via the system bus 18. The controller 16 that loads coarse time delay values into the counter. The counter circuitry counts the clock pulses of the gated or phase controlled clock signal and generates an output when the clock count equals the course time delay value. The output from the counter circuitry is coupled to a ramp generator that is part of the interpolator circuitry providing 0-3 ns time delay change. The ramp generator initiates a ramp signal that is coupled to the minus input of a comparator circuit. The plus input to the comparator circuit is an analog signal from a digital-to-analog converter. The D/A converter is a 14 bit device that receives digital-to-analog converter (DAC) code values from a horizontal look-up table stored in memory 20. The horizontal look-up table contains DAC values that correct for non-linearities in the interpolator circuitry. The output of the timebase 28 is strobe pulses provided to the sampling module 34 and the phase reference module.

Figure 3:
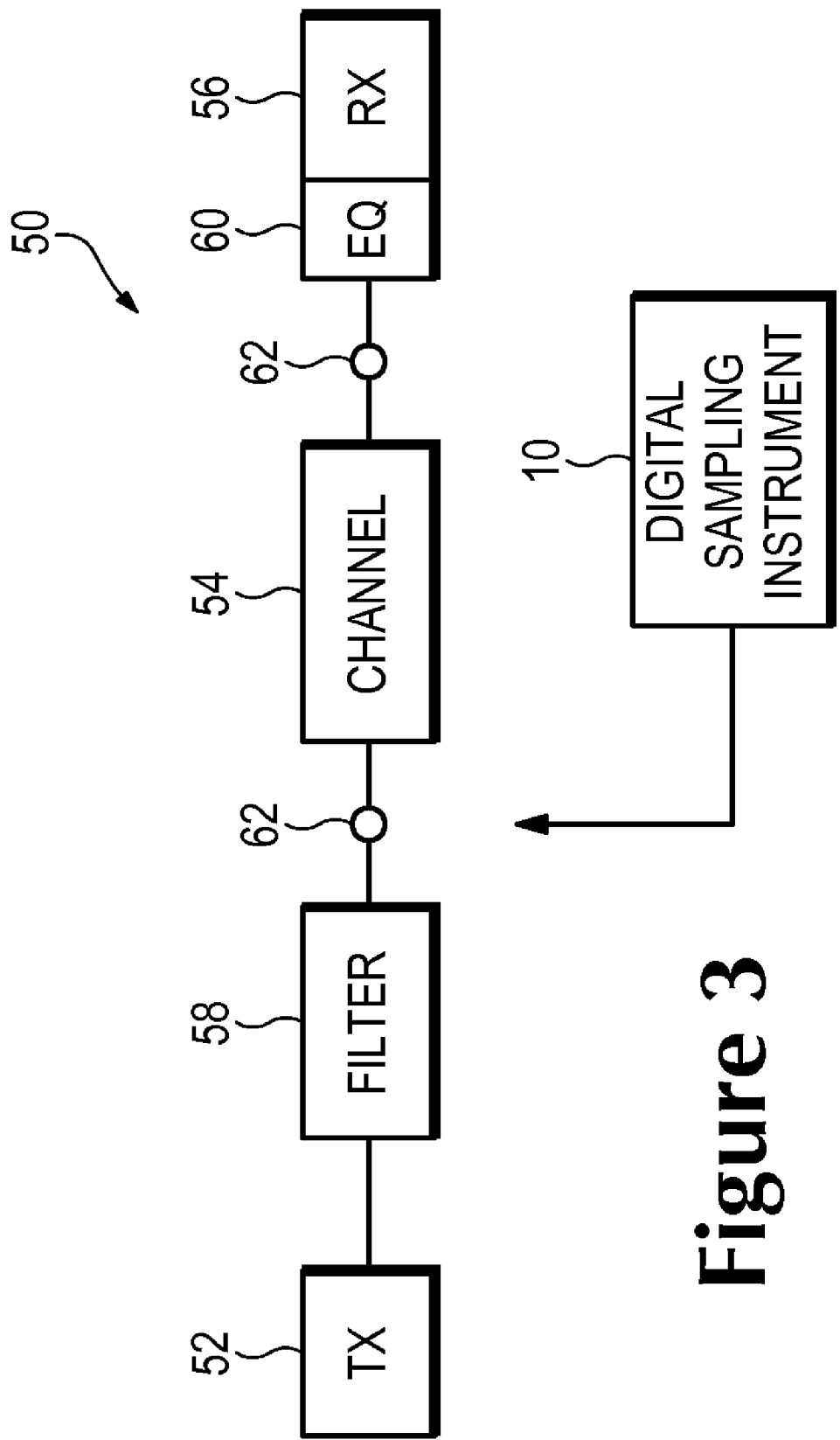
FIG. 3 is a representation of a serial communications system.

Referring to FIG. 3, there is shown a representation of a serial communications system 50 having a transmitter 52 for transmitting serial communication data, a channel 54, such as traces on a personal computer mother board, for coupling the serial communications data to a receiver 56. The transmitter may include a pre-emphasis amplification filter or de-emphasis filter as represented by block 58. The filter block may also represent other types of filtering, such as a filter for removing the effects of circuit traces and cabling between the transmitter integrated circuit and the receiver. The receiver may have an equalizer that is represented by EQ block 60. The digital sampling instrument 10, such as the above described digital sampling oscilloscope, real time digital sampling oscilloscopes, can probe the serial communications system 50 at various test points in the system as represented by test point 62. Further, the transmitter 52 and channel 54 may be simulated by a data generator applying signal impairments to a communication signal and coupled to the input of the Sampling Module 34.

Figure 4A:
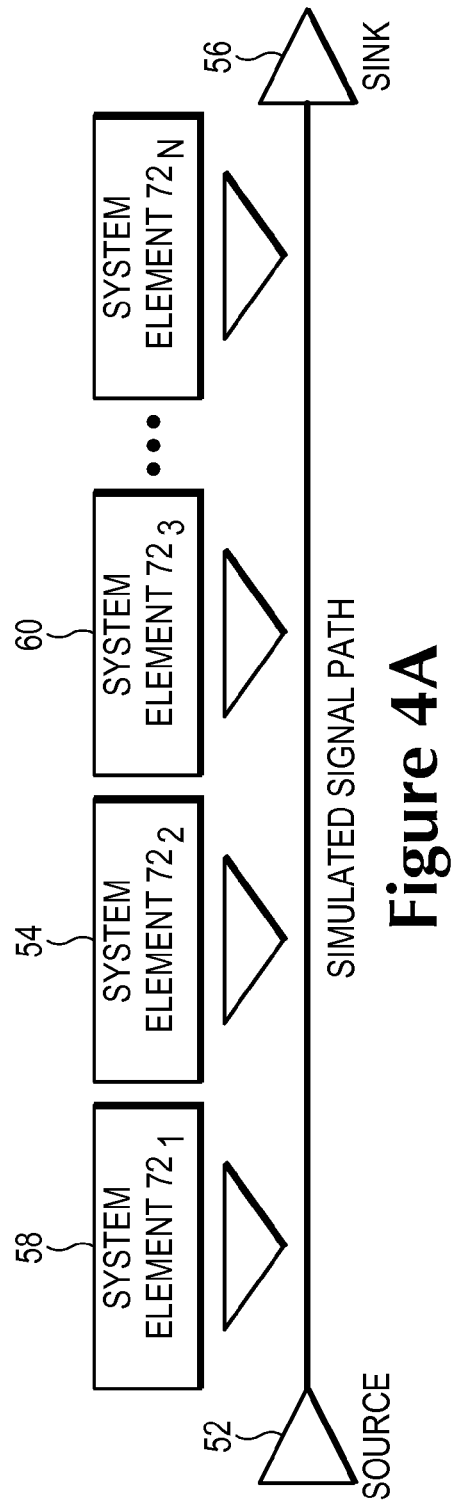
FIGS. 4A and 4B illustrates a simulated signal path for implementing the system for independently processing pattern data jitter and noise components in a signal.
Figure 4B:
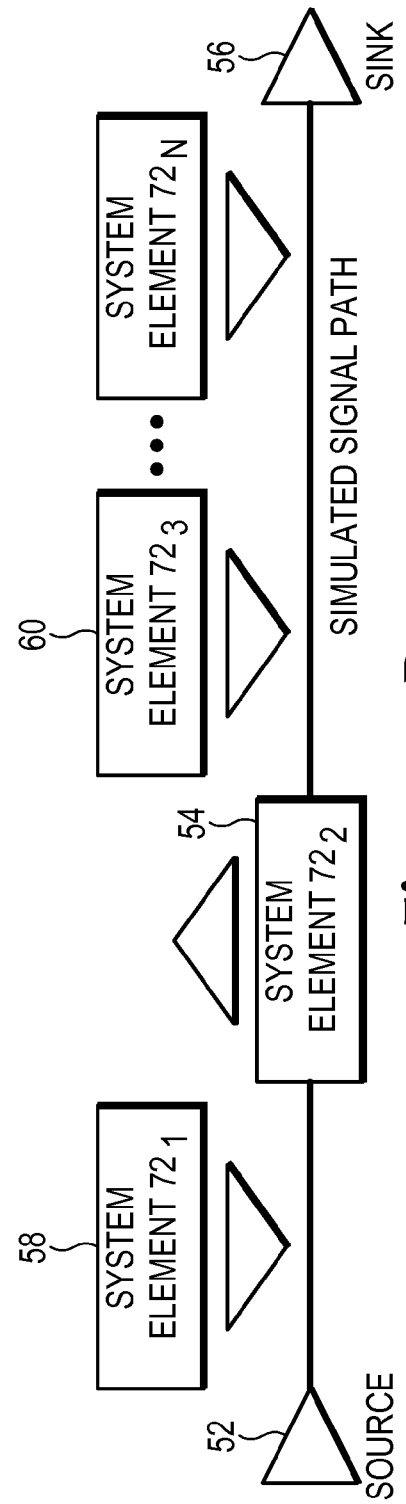

FIGS. 4A and 4B depicts a simulated signal path 70 of the communications system 50 generated in a digitizing instrument 10. The source 52, in the present embodiment the digitized data samples of the communication signal from the A/D converter 32, provides the communication signal to the simulated signal path 70 and the sink 56, in the present embodiment a display controller for displaying the digitized data samples receives the communication signal. Disposed above the simulated signal path 70 are communication system elements $72_1, 72_2, 72_3, \ldots 72_n$ with each of the communication system elements $72_1, 72_2, 72_3, \ldots 72_n$ having an associated down arrow. In the present invention, the element $72_1$ represents the filter element 58, the element $72_2$ represents a channel element 54, and the element $72_3$ represents the equalizer element 60. Clicking on one of the down arrows associated with the elements $72_1, 72_2, 72_3, \ldots 72_n$ will cause the element to be inserted in to the simulated signal path 70 as is shown by the element $72_2$ in FIG. 4B. With the element $72_2$ inserted into the signal path 70, the arrow changes to an up arrow. Clicking on the up arrow removes the element $72_2$ from the simulated signal path 70. A user interface may be implemented to allow one or more of the communications system elements to be inserted into the simulated signal path 70.

Figure 5A:
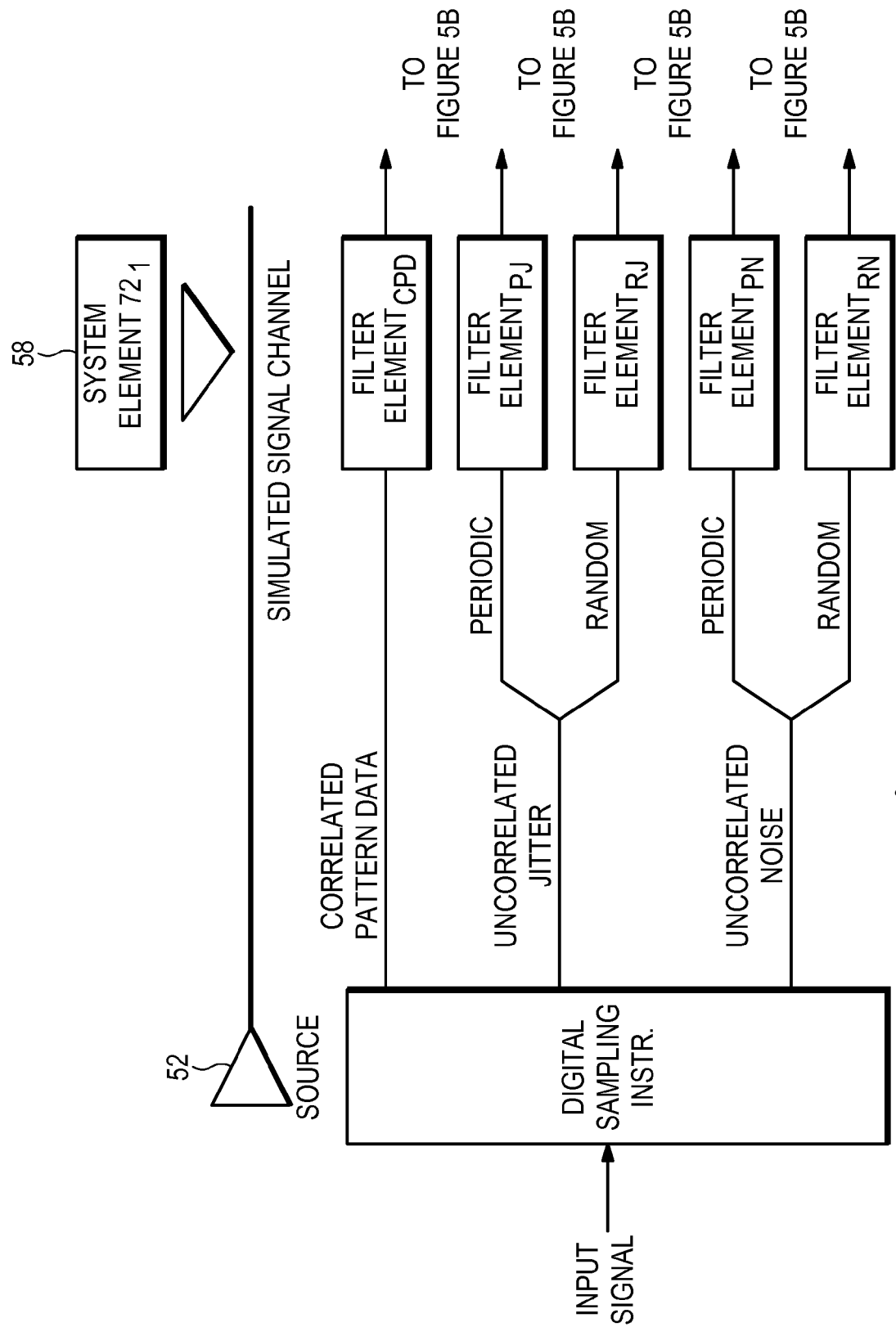
FIGS. 5A and 5B illustrate the system for independently processing jitter and noise components in a signal.
Figure 5B:
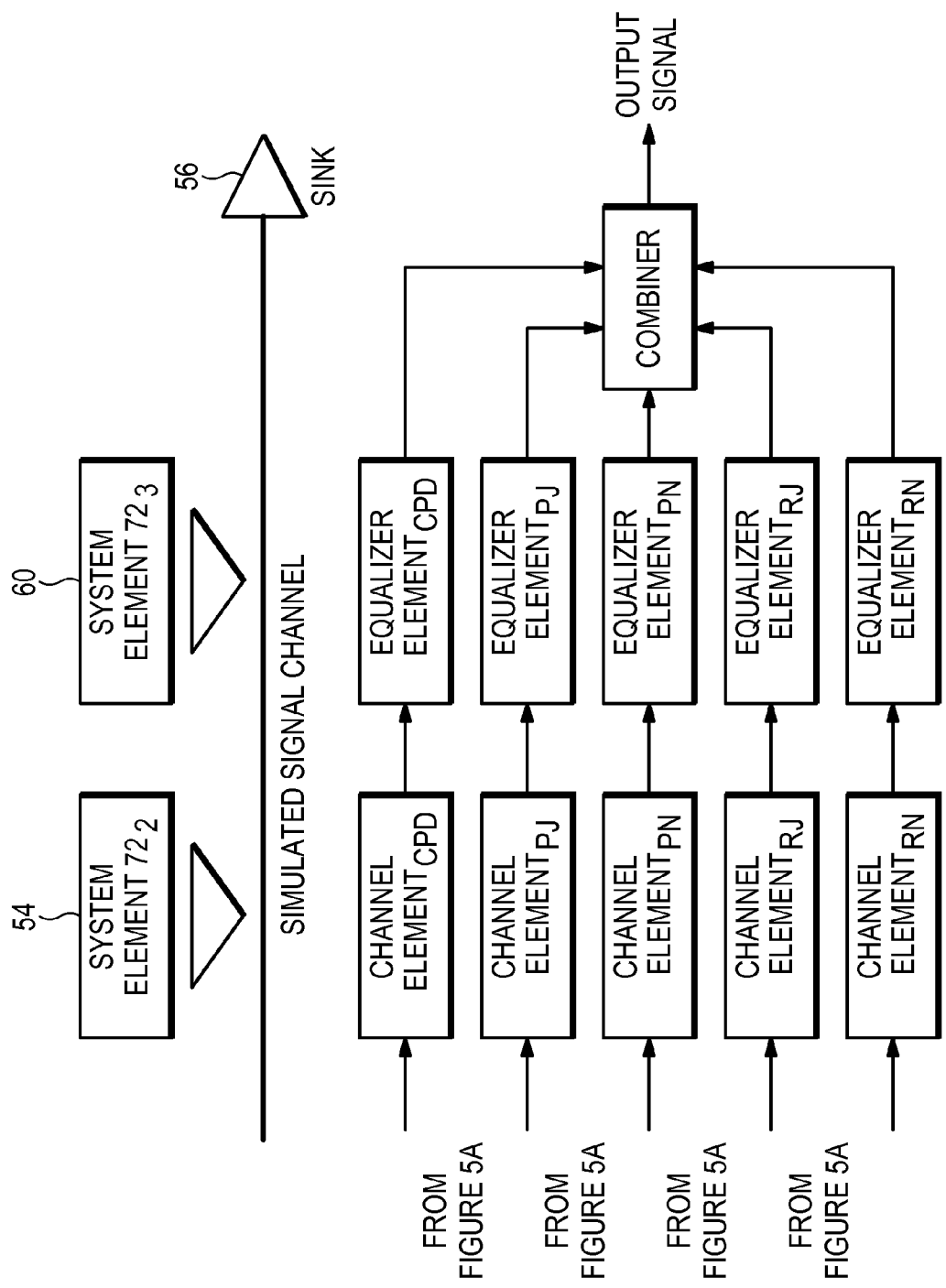

FIG. 5 illustrates the system for independently modifying correlated pattern data and jitter and noise components in a communication signal. The communication signal in the signal communication system is sampled by the oscilloscope 10 at one of the test points 62 or received from the data generator. The sampling of the communication signal is performed in various ways. To obtain a correlated pattern of the communication signal, the timebase 28 is configured to highly sample the communications signal. The counter and interpolator circuitry in the strobe generator receives initial course and fine time values from the controller 16. For each trigger pulse from the trigger circuitry, the fine time delay is incremented so that the oscilloscope acquires 100 samples per bit quantized to the oscilloscopes 1 fsec time resolution the correlated pattern data.

From the correlated pattern data, the slope and midpoint of an edge in the data is determined. With the edge slope and midpoint determined, the timebase is set-up to acquire samples at a nominal time location on an edge of the communication signal. Preferably the nominal time location for the sampling is set as close to the trigger as possible and at the midpoint on the edge. For the DSA8200 Digital Sampling Oscilloscope, the various internal signal delays results in an approximate 20 nsec delay from the trigger signal to the application of the strobe to the Sampling Module 34. The counter and interpolator circuits in the timebase are set-up to provide a hold-off time so that the nominal time location is on the first full edge of the communication signal after the internal 20 nsec time delay of the oscilloscope. Generally, the nominal time location is in the range of 20 nsec to 30 nsec. The oscilloscope 10 is set for the smallest time span and multiple voltage sample records are acquired at the nominal time location of the edge slope of the communication signal. Sampling of the edge of the communication signal generates voltage samples containing information on the uncorrelated jitter and noise. Also from the correlated pattern data, the mid-point of a horizontal (flat) portion of the correlated pattern data is determined. The sampling delay (time location) of the timebase 28 is set to a nominal time location on the top or bottom horizontal area of the communication signal. The oscilloscope 10 is set for the smallest time span, and multiple voltage sample records are acquired at the nominal time location of the top or bottom horizontal area of the communication signal. Sampling the horizontal portion of the communication signal generates voltage samples containing information on the uncorrelated noise.

Alternately, the oscilloscope 10 can acquire data samples of the data pattern in the communications signal and process the data pattern to determine the slope and midpoint of an edge in the data as well as the mid-point of the horizontal (flat) portion of the correlated pattern data. The jitter and noise components are characterized and the communication signal is re-sampled to generate the correlated pattern data waveform, as described above.

The voltage samples of the jitter and the noise are converted to the frequency domain via well know frequency transforming techniques, such as Fast Fourier Transform (FFT), windowing and the like. The frequency domain spectra of the jitter contain both random and periodic jitter and noise. The frequency domain spectra of the noise contain both random and periodic noise. Random jitter and noise threshold levels are determined for each of the frequency domain spectra of the jitter and noise. The spectral components of the periodic noise (Pn) above the random noise threshold level are identified and removed from the frequency domain noise spectra. The resulting noise spectra represent the random noise. The resulting noise spectra are integrated to determine the standard deviation which is an estimate of the true random noise (Rn). The spectral components of the periodic jitter Pj in the frequency domain spectra of the jitter above the jitter noise threshold are identified and removed from the frequency domain jitter spectra. The resulting jitter spectra represent the observed random jitter $R_oj$. The observed random jitter $R_oj$ contains both the true random jitter components, $R_j$, as well as vertical noise components translated through the edge slew rate (SR) into apparent jitter components. The observed random jitter spectra are integrated to determine the standard deviation which is an estimate of the observed random jitter $R_o j$. The true random jitter $R_j$ is extracted according to the following equation:

$$R_j = \sqrt{R_o j^2 - \left(\frac{R_n}{SR}\right)^2} \qquad \text{EQ. 1}$$

where $R_o j$ is the observed random jitter, $R_n$ is the random noise and SR is the slew rate of the edge slope approximated by a straight line.

The identified periodic spectral components of the noise and jitter above the respective noise and jitter threshold levels are reconciled frequency by frequency in the frequency domain spectra. If a periodic spectral component is observed in the jitter spectra at a particular frequency but not in the noise spectra, it is considered a true periodic jitter $P_j$ spectral component. If the periodic spectral component is observed in both the jitter and noise spectra at a particular frequency, it is considered to be a true periodic noise $P_n$ spectral component and is identified as such. The identified periodic noise spectral components in the jitter spectra are removed along with the random jitter below the random jitter threshold level resulting in the a periodic jitter spectra Pj. Likewise, the identified periodic jitter spectral components in the noise spectra are removed along with the random noise below the random noise threshold level resulting in the periodic noise spectra Pn. The periodic jitter spectra Pj and the periodic noise spectra Pn are converted to the time domain using well known Inverse Fast Fourier Transform (FFT) algorithms. Respective histograms are generated for the time domain periodic jitter and the time domain periodic noise. The peak-to-peak time from the time domain jitter histogram is the periodic jitter value and the peak-to-peak voltage values of the time domain noise histogram is the periodic noise histogram.

Each of the random jitter and noise components and each of the periodic jitter and noise components have different statistical behavior. Therefore, each component needs to be modified in a separate manner to generate a modified emulation or simulation of a communication signal for display on the display 22. For each communication system element $72_1$, $72_2$, $72_3$, ... $72_n$, various modifications of the simulated signal path 70 are made using the correlated pattern data, random jitter, periodic jitter, random noise, and periodic noise components. For example, filter element$_{CPD}$ of the correlated pattern data may be a time domain filter that can be applied to the correlated pattern. The filter may be defined by the user and stored as a file filter parameters using text filter design software provided by the oscilloscope maker. The text file is converted to the filter having the desired response. The filter is convolved with the correlated pattern data. Filter element of the periodic jitter and filter element$_{PN}$ of the periodic noise may be notch filters for removing particular periodic jitter and noise. The filter element and filter element$_{PN}$ may also be scalar values applied to the respective periodic jitter and periodic noise values. Filter element$_{RJ}$ of the random jitter and the filter element$_{RN}$ of the random noise may be scalar values applied to the respective random jitter and random noise values.

Channel element$_{CPD}$ of the correlated pattern may define characteristics of the channel to be applied to the correlated pattern data. The channel element$_{CPD}$ characteristics may be defined as S-parameter data or as TDR waveforms. The S-parameter data is converted to a time domain representation. The time domain characteristics are then convolved with the correlated pattern. The channel elements for the various jitter and noise components may be selectable scalars values applied to the jitter component time values and the noise component voltage values. The equalizer element$_{CPD}$ of the correlated pattern data defines feed-forward equalizer filter taps. Once the user had defined the equalizer, a software algorithm creates the time domain equalizer filter. The time domain equalizer filter is convolved with the correlated pattern. The convolution of the correlated pattern data with each of the correlated pattern data elements is sequential. That is, the results of the convolving of the correlated pattern data with the filter element is convolved with the time domain channel characteristic with the result convolved with the time domain equalizer filter or any combination thereof.

The periodic jitter and noise components need to be de-aliased in the digital sampling oscilloscope to correctly identify fundamental base frequency components of the periodic jitter as well as the harmonic components of the base frequency components. In a high speed real time digital oscilloscope, the sampling bandwidth is sufficiently high to negate the aliasing of the periodic jitter and noise components. The frequency domain characteristic of the periodic jitter and the periodic noise may be used for defining filters for the communication system elements $72_1$, $72_2$, $72_3$, ... $72_n$. The filter element of periodic jitter and the filter element$_{PN}$ of the periodic noise may include defining a frequency response filter for a characteristic of the transmitter, such as pre-emphasis and multiplying the frequency response filter with the frequency spectral components of the periodic jitter and the periodic noise. The channel element of the periodic jitter and the channel element$_{PN}$ of the periodic noise may include defining the frequency characteristic of the channel using S-parameters and multiplying the S-parameters with the frequency spectral components of the periodic jitter and the periodic noise. The equalizer element$_{PJ}$ of the periodic jitter and the equalizer element$_{PN}$ of the periodic noise may include defining a high pass filter representing the equalizer and multiplying the frequency response of the high pass filter with the frequency spectral components of the periodic jitter and the periodic noise. Each of the filter, channel and equalizer periodic jitter elements is multiplied sequentially. The resulting frequency response spectrum is transformed into the time domain using well known transformation techniques, such as an inverse FFT, inverse DFT and the like. Likewise, each of the filter, channel and equalizer periodic noise elements is multiplied sequentially. The resulting frequency response spectra is transformed into the time domain using well known transformation techniques, such as an inverse FFT, inverse DFT and the like. The time domain representation of the modified periodic jitter elements and modified periodic noise elements are convolved with the time domain representation of the modified random jitter elements and modified random noise elements and the modified correlated pattern data elements.

The frequency components of the observed random jitter and the random noise may be integrated to produce the respective random jitter value in time and the random noise value in volts. Alternately, the frequency components of the observed random jitter and the random noise may be converted to the time domain using well known conversion algorithms, such as an such as an inverse FFT, inverse DFT and the like. A histogram is generated for each of the time domain observed random jitter and random noise. The first sigma of the respective histograms of the time domain observed random jitter and random noise are used for the observed jitter value and the random noise value.

The correlated pattern data, random jitter, periodic jitter, random noise, and periodic noise components are combined together to create a statistical model of a communication signal represented by the cumulative bit error rate eye of the system. The cumulative bit error rate eye is displayed on display 22. The derived BER eye is used for generating a bath tub curve of the bit error rate estimation. An eye pattern of the statistical model of the cumulative bit error rate eye of the combined communication signal may also be displayed on display 22

The method of modifying pattern data and jitter and noise components in a communication signal may be used in de-embedding the random noise of the digitizing instrument 10. The digitizing instrument 10 is set to the smallest time span and digital data sample records are acquired at a nominal time location with no signal input to the digitizing instrument 10. The digital data sample records are converted to a frequency domain representation producing an observed noise spectra of the digitizing instrument. The periodic noise components, if any, are identified and removed from the observed noise spectra producing random noise spectra. The random noise spectra are integrated to produce a random noise voltage value. The periodic noise spectra are converted to the time domain using IFFT algorithm or the like. A histogram of the periodic noise is generated and the peak-to-peak value of the histogram is the periodic noise time value. The random noise voltage value is subtracted from the previously characterized random noise voltage value of the communication signal to de-embed the random noise of the digitizing instrument from the communication signal which reduces the noise floor for the communication signal. Likewise, the periodic noise time value may be subtracted from the previously characterized periodic noise time value of the communication signal. The modified random noise and/or the periodic noise of the communication signal are combined with the random jitter periodic jitter and noise, and the correlated pattern data of the sampled communication signal. The combined communication signal is displayed on display 22 to show changes in an eye diagram and/or bit error rate displays of de-embedding the digitizing instrument random noise and/or periodic noise of the communication signal.

The method of modifying pattern data and jitter and noise components in a communication signal may also be used in varying the random jitter. The oscilloscope is set-up to acquire digital data samples along a rising edge of the communication signal. Using the straight line approximation, the slew rate SR (da/dt) of the acquired digital data samples is determined. The amplitude deviation (da) for each amplitude sample is determined as the difference between the straight line approximation and each amplitude sample. The ratio of the amplitude deviation (da) divided by the slew rate (da/dt) converts each amplitude deviation (da) into a timing deviation (dt). The random jitter component is modified as a function of varying the characterized random noise using Equation 1. The square root of the observed jitter squared minus the division of the random noise by the slew rate squared produces the random jitter time value. As the random noise is increased or decreased, the random jitter will decrease or increase. The modified random jitter may be provides to each filter, channel, equalizer element of the plurality of communication system elements $72_1$, $72_2$, $72_3$, ... $72_n$ in the simulated signal path 70. The modified random jitter and random noise components of the communication signal are combined with the uncorrelated periodic jitter and noise components first, and the correlated pattern data of the communication signal next. The combined and modified digitized signal is displayed on display 22 to illustrate changes in an eye diagram and bit error rate displays as a function of modifying random jitter as a function of varying the characterized random noise.

The method of modifying pattern data and jitter and noise components in a communication signal may be used in estimating the effects of crosstalk on the communication signal. As previously described, the digital data value records acquired at the nominal time locations on the rising edge of the communication signal and horizontal portion of the communication signal are converted to a frequency domain representations of the observed jitter spectra and observed noise spectra using well know conversion algorithms, such as a Fast Fourier Transform (FFT) and the like. The periodic spectral components of the observed noise spectra are identified as well as the periodic spectral components of the observed jitter spectra. The periodic spectral components of the observed noise spectra above a noise threshold level and the periodic spectral components of the observed jitter spectra above a jitter threshold level are reconciled frequency by frequency in the observed noise spectra and observed jitter spectra. If a periodic spectral component is observed in the jitter spectra at a particular frequency but not in the noise spectra, it is considered a true periodic jitter $P_j$ spectral component. If the periodic spectral component is observed in both the jitter and noise spectra at a particular frequency, it is considered to be true periodic noise $P_n$ spectral component and identified as such. The identified periodic noise spectral components in the jitter spectra are removed along with the random jitter below the random jitter threshold level resulting in the a periodic jitter spectra Pj. Likewise, the identified periodic jitter spectral components in the noise spectra are removed along with the random noise below the random noise threshold level resulting in the periodic noise spectra Pn. The periodic jitter spectra Pj and the periodic noise spectra Pn are converted to the time domain using well known Inverse Fast Fourier Transform (IFFT) algorithms. Respective histograms are generated for the time domain periodic jitter and the time domain periodic noise. The difference between the peak-to-peak times from the time domain jitter histogram is the periodic jitter value and the difference between the peak-to-peak voltage values of the time domain noise histogram is the periodic noise value. The periodic noise value is displayed as crosstalk on the communication signal.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of modifying measured or synthesized pattern data and jitter and noise components in a signal comprising the steps of:

acquiring digital data samples of a signal using the digitizing instrument;

generating correlated pattern data of the sampled signal using the digitizing instrument;

acquiring digital data samples of the signal for respectively generating observed jitter and observed noise components using the digitizing instrument;

characterizing random jitter and noise components and periodic jitter and noise components from the observed jitter and observed noise components of the sampled signal using the digitizing instrument;

selectively modifying the correlated pattern data, uncorrelated random jitter and noise components, and uncorrelated periodic jitter and noise components of the sampled signal for each element of a plurality of elements in a simulated signal path using the digitizing instrument;

combining the selectively modified correlated pattern data, random jitter and noise components, and periodic jitter and noise components of the sampled signal using the digitizing instrument;

displaying the result of the combination of the selectively modified correlated pattern data, uncorrelated random jitter and noise components, and uncorrelated periodic jitter and noise components of the sampled signal illustrating changes in at least one of an eye diagram, bit error rate eye and numeric table displays as a function of selectively modifying the correlated pattern data, uncorrelated random jitter and noise components and uncorrelated periodic jitter and noise components of the sampled signal using the digitizing instrument.

2. The method of modifying measured or synthesized pattern data and jitter and noise components in a signal as recited in claim 1 wherein the characterizing step further comprises the step of converting the digital data samples of the signal to frequency domain representations prior to characterizing random jitter and noise components, and periodic jitter and noise components.

3. The method of modifying measured or synthesized pattern data and jitter and noise components in a signal in a signal as recited in claim 2 further comprising the steps of:

acquiring digital data samples of the digitizing instrument for respectively generating observed jitter and observed noise components;

characterizing random jitter and noise components and periodic jitter and noise components of the digitizing instrument from the observed jitter and observed noise components of the digitizing instrument modifying at least one of the characterized uncorrelated random and jitter and noise components and the periodic jitter and noise components of the digitizing instrument on the corresponding characterized uncorrelated random jitter and noise components and the periodic jitter and noise components of the sampled signal; and displaying the results of the recombination of the selectively modified random jitter and noise components, periodic jitter and noise components, and the correlated pattern data of the sampled signal that illustrate changes in at least one of an eye diagram and bit error rate displays as a function of modifying at least one of the characterized random jitter and noise components and the periodic jitter and noise components of the digitizing instrument on the corresponding characterized random jitter and noise components and the periodic jitter and noise components of the sampled signal.

4. The method of modifying measured or synthesized pattern data and jitter and noise components in a signal as recited in claim 3 wherein the modifying step further comprises the steps of:

modifying the characterized uncorrelated random and jitter and noise components and the periodic jitter and noise components of the digitizing instrument on the corresponding characterized uncorrelated random jitter and noise components and the periodic jitter and noise components of the sampled signal to de-embed the characterized uncorrelated random and periodic jitter and noise components of the digitizing instrument from the characterized uncorrelated random and periodic jitter and noise components of the signal; and displaying the results of the recombination of the selectively modified random jitter and noise components, periodic jitter and noise components, and the correlated pattern data of the sampled signal that illustrate changes in at least one of an eye diagram and bit error rate displays as a function of modifying the characterized random jitter and noise components and the periodic jitter and noise components of the digitizing instrument on the corresponding characterized random jitter and noise components and the periodic jitter and noise components of the sampled signal to de-embed the characterized uncorrelated random and periodic jitter and noise components of the digitizing instrument from the characterized uncorrelated random and periodic jitter and noise components of the signal.

5. The method of modifying measured or synthesized pattern data and jitter and noise components in a signal as recited in claim 2 wherein the characterizing step further comprising the step of:

determining a slew rate of the signal as a function of an approximation of a portion of an edge of the signal.

6. The method of modifying pattern data and jitter and noise components in a communication signal as recited in claim 5 wherein the modifying step further comprising the step of:

modifying the random jitter component as a function of varying the characterized random noise and removing a scalable part of the characterized random noise from the observed jitter component for each element of the plurality of elements in the simulated signal path; and displaying the combined selectively modified random jitter and noise components, periodic jitter and noise components, and the correlated pattern data of the signal that illustrates changes in at least one of an eye diagram and bit error rate displays as a function of removing a scalable part of the varied characterized random noise from the observed jitter component.

7. The method of modifying pattern data and jitter and noise components in a communication signal as recited in claim 2 wherein the characterizing step further comprising the step of:

identifying and storing magnitude and frequency values for peaks in the frequency domain representations of the observed jitter and observed noise of the sampled communications signal;

determining the periodic jitter and periodic noise in the stored magnitude and frequency values for peaks of the observed jitter and observed noise;

converting the determined periodic jitter and periodic noise to time domain representations;

generating respective histograms of the time and voltage values of the respective periodic jitter and periodic noise;

determining peak-to-peak time and voltage values of the respective histograms of the periodic jitter and periodic noise; and displaying the noise value of the periodic noise as crosstalk on the communication signal.

* * * * *